United States Patent [19]

Callan et al.

[11] 4,039,855
[45] Aug. 2, 1977

[54] SOLID STATE RELAY

[75] Inventors: John E. Callan, Milwaukee; Harold J. Pollnow, Jr., Dousman, both of Wis.

[73] Assignee: Allen-Bradley Company, Milwaukee, Wis.

[21] Appl. No.: 663,523

[22] Filed: Mar. 3, 1976

[51] Int. Cl.² .................. H03K 17/60; H03K 5/13
[52] U.S. Cl. .......................... 307/203; 307/252 B; 307/293
[58] Field of Search .................... 307/203, 252 B, 293

[56] References Cited

U.S. PATENT DOCUMENTS

| | | | |
|---|---|---|---|
| 3,483,399 | 12/1969 | Walter et al. | 307/252 B |
| 3,553,495 | 1/1971 | Shaugnessy | 307/252 B |
| 3,588,540 | 6/1971 | Bohn | 307/293 |
| 3,656,005 | 4/1972 | Lee | 307/293 |
| 3,688,130 | 8/1972 | Graniei | 307/252 B |
| 3,740,587 | 6/1973 | Lee | 307/252 B |
| 3,774,051 | 11/1973 | Chandler, Jr. | 307/203 |
| 3,786,328 | 1/1974 | Bos | 307/252 B |
| 3,890,512 | 6/1975 | Kumakawa et al. | 307/203 |
| 3,963,947 | 6/1976 | Bogel | 307/203 |

Primary Examiner—Stanley D. Miller, Jr.
Attorney, Agent, or Firm—Quarles & Brady

[57] ABSTRACT

A solid state equivalent of a relay includes a pair of time delay circuits having inputs which couple to a pseudo coil terminal. One time delay circuit couples to drive a bilateral switch which simulates the operation of a set of normally closed relay contacts and the other time delay circuit is connected in series with an inverter gate and coupled to drive a second bilateral switch which simulates the operation of a set of normally open relay contacts.

5 Claims, 1 Drawing Figure

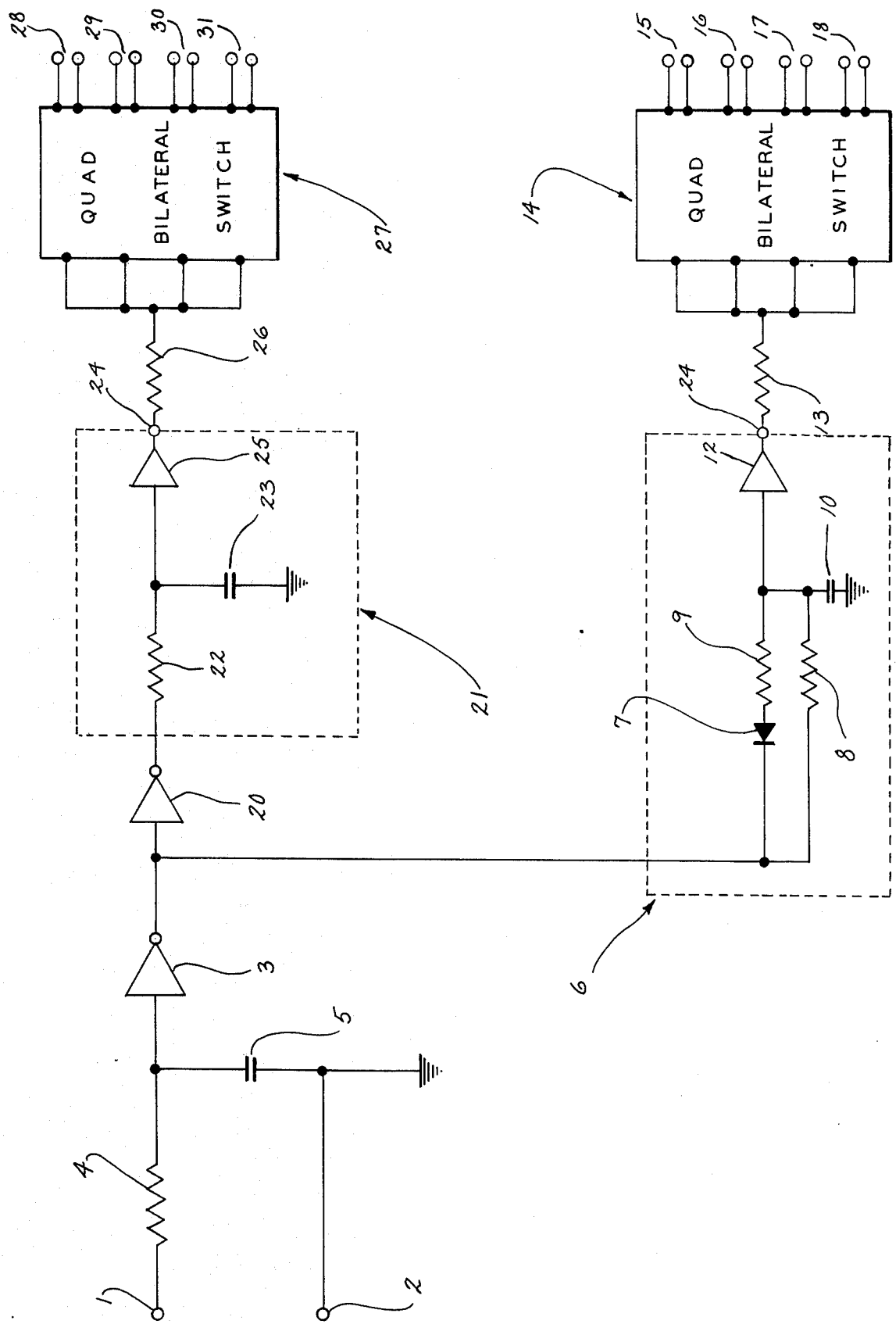

SOLID STATE RELAY

BACKGROUND OF THE INVENTION

The field of the invention is solid state industrial control systems, and particularly, controllers formed by interconnecting solid state logic circuits which are functionally equivalent to relays.

Solid state controllers are often employed to control industrial processes and machines which have traditionally been controlled by relay networks, or panels. A practical limitation on their further use in such applications, however, has been the reluctance of control engineers and maintenance personnel to relinquish their knowhow and experience with relays in favor of Boolean algebra and logic circuit design. As a result, in recent years a number of solid state circuits have been proposed which simulate the operation of a relay and which can be combined with other similar circuits to form a solid state controller which simulates the operation of a relay controller.

In U.S. Pat. No. 3,774,051, for example, a time delay circuit is combined with a logic gate to provide a solid state equivalent of a relay. Similarly, U.S. Pat. No. 3,890,512 discloses a simulated relay comprised of interconnected inverter gates and AND gates. Although prior solid state relays simulate the logical functions of an electromagnetic relay, they do not simulate a number of electrical characteristics which are important in many applications. One such characteristic of relays not found in prior solid state simulations is the ability of the contacts to conduct current in either direction when they are closed. Also, when a relay coil controls a plurality of contacts, mechanical means are employed to insure that closed contacts open before open contacts close, or vice versa, when the coil is either energized or deenergized.

SUMMARY OF THE INVENTION

The present invention relates to a solid state circuit which simulates the functions of a relay. More particularly, the invented circuit includes a pseudo coil terminal which connects to the input of a time delay circuit which is operable to generate a delayed logic signal at its output, a pair of pseudo contact terminals, and a solid state bilateral switch which connects to the output of the time delay circuit and is responsive to the delayed logic signal which it generates to open and close said pseudo contact terminals, wherein current can flow in either direction through the pseudo contact terminals when the bilateral switch is closed.

The invention further provides a second time delay circuit which couples to the pseudo coil terminal and generates a delayed logic signal to a second bilateral switch. The output of the second bilateral switch controls the conductivity between a second set of pseudo contact terminals to allow current flow therethrough in either direction when closed.

A general object of the invention is to provide a solid state equivalent of a relay which allows current to flow in either direction when the pseudo contacts are closed.

Another general object of the invention is to provide a solid state equivalent of a relay which simulates the make-before-break or break-before-make operation of a plurality of relay contact sets controlled by a single coil. By adjusting the delays provided by the respective time delay circuits of the present invention, the operation of the bilateral switches can be separately timed with respect to one another. Also, by employing a bidirectional time delay circuit, the "pickup" and "dropout" response of each set of emulated contacts controlled thereby can be separately determined and adjusted.

Other objects and advantages of the invention will become apparent from the description to follow. In the description reference is made to the accompanying drawing which forms a part hereof and in which there is shown by way of illustration a preferred embodiment of the invention. Reference is made to the claims herein for interpreting the breadth of the invention.

BRIEF DESCRIPTION OF THE DRAWING

The drawing is an electrical schematic diagram of the invented solid state circuit which simulates a relay having four normally open and four normally closed sets of contacts.

DESCRIPTION OF THE PREFERRED EMBODIMENT

The circuit of FIG. 1 emulates an eight-pole relay having four sets of normally open contacts and four sets of normally closed contacts. It includes a pair of pseudo coil terminals 1 and 2 across which an input signal is applied to control the operation of the circuit. One of the coil terminals 2 connects to circuit ground and the other terminal 1 connects through a noise filter to the input of an inverter gate 3. The noise filter is comprised of a series resistor 4 and a shunt capacitor 5 and the gate 3 is a commercially available integrated circuit which generates a logic low voltage at its output when the voltage at its input rises to a predetermined level. An inverter gate such as serial number CD4049 commercially available from RCA is preferred.

The output of the inverter gate 3 connects to a time delay circuit indicated generally at 6. More specifically, it connects to the cathode of a diode 7 and to one lead on a resistor 8. The anode of dode 7 is connected in series with a second resistor 9 and both resistors 8 and 9 connect to a charging capacitor 10. The charging capacitor 10 also connects through a buffer 12 to a time delay circuit output terminal 11 and its other lead connects to circuit ground. The buffer 12 is a commercially available integrated circuit such as serial number CD4050 available from RCA, which generates a logic high voltage at its output when the voltage at its input rises to a predetermined level.

When a logic low voltage is generated at the output of the inverter gate 3, the capacitor 10 discharges through the parallel ranches formed by the resistor 8 and the diode 7 and resistor 9. A low voltage is thus applied to the buffer 12 which generates logic low voltage at the output terminal 11. A discharge time of approximately 1 millisecond is set by choosing appropriate values for the resistors 8 and 9 and the capacitor 10. When the output of the inverter gate 3 changes to a logic high voltage state, the capacitor charges through the resistor 8 and when it reaches the threshold voltage of the buffer 12, a logic high voltage is generated at the output terminal 11. The diode 7 thus blocks current flow through resistor 9 when capacitor 10 is being charged, and by selecting the value of resistor 8 to be approximately ten times larger than the parallel combination of resistors 8 and 9, the charge time of the capacitor 10 is slowed to approximately ten milliseconds.

It should be apparent that the time delay is "bidirectional" in the sense that it provides one time delay to a voltage transition from one logic state to another and it provides a second, separately determinable time delay to a voltage transition in the reverse direction. The values of the resistors 8 and 9 can, of course, be altered to provide the desired time delay in each direction, and the connection of the diode 7 can be reversed to switch the direction of the two predetermined time delays.

The output 11 on the time delay circuit 6 connects through a coupling resistor 13 to for control terminals on a quad bilateral switch circuit 14. The bilateral switch 14 is an integrated circuit such as serial number CD4066AE which is commercially available from RCA. Each of the four control terminals on the bilateral switch 14 controls, or operates, a solid state switch which in turn controls the conductivity between associated pairs of pseudo contact terminals 15-18. More specifically, when the output 11 of the time delay circuit 6 rises to a logic high voltage, the bilateral switch 14 is energized and the four solid state switches therein become conductive. Current can then flow in either direction through each pair of terminals 15-18 to emulate four sets of normally closed relay contacts. On the other hand, when a logic high voltage is applied to the pseudo coil terminal 1 the output terminal 11 of the time delay circuit 6 drops to a logic low voltage which is applied to deenergize the bilateral switch 14. In response, the bilateral switch opens circuit between each of the pseudo contact pairs to emulate four sets of open relay contacts.

It should be apparent from the above description that the bidirectionality of the time delay circuit 6 allows the separate control of the pickup and dropout response of the emulated normally closed contacts. In the preferred embodiment described, the pickup response is approximately 10 milliseconds and the dropout response is approximately 10 millisecond; however, these can easily be changed as indicated above. Indeed, variable resistors or resitor networks my be employed to facilitate changes by the user.

The inverter gate 3 also operates four sets of emulated normally open contacts. More specifically, its output connects through a second identical inverter gate 20 to a second time delay circuit 21. The circuit 21 is comprised of a series resistor 22, a charging capacitor 23 which connects to circuit ground, and a buffer 25. The voltage across the charging capacitor 23 is applied to buffer 25 which in turn is connected to an output terminal 24. A series connected resistor 26 couples the time delay circuit output 24 to a set of four control terminals on a second quad bilateral switch circuit 27. The buffer circuit 25 and bilateral switch 27 are identical to the buffer circuit 12 and bilateral switch 14 described above. The second bilateral switch 27 emulates four contacts and includes outputs which connect to four pairs of pseudo contact terminals 28-31.

When a logic low voltage is applied to the pseudo coil terminal 1 the second inverter gate 20 applies a logic low voltage to the time delay circuit 21. This logic low voltage is applied to the control terminals of the bilateral switch 27 to drive the four emulated contacts to a normally open state. When a logic high voltage is applied to the coil terminal 1, the output of the second inverter 20 rises and the capacitor 23 charges through resistor 22. The voltage at the time delay output 24 increases to a logic high voltage in approximately three milliseconds, at which time the bilateral switch 27 is operated to close the emulated contacts therein. As a result, current may flow in either direction through the pseudo contact terminals 28-31.

The time delay circuit 21 provides both a pickup response and a dropout response of approximately three milliseconds. This allows the bilateral switch 14 to open its contacts (1 msec.) before the second bilateral switch 27 closes its contacts (3 msec.). On the other hand, when a logic low voltage is applied to the coil terminal 1 the bilateral switch 27 opens its contacts (3 msec.) before the bilateral switch 14 closes its contacts (10 msec.). Although preferred relay operation is thus accurately simulated, it should be apparent that other modes of operation can be accomplished by using a second bidirectional time delay circuit in place of the circuit 21 and by adjusting the values of the resistors therein to provide a multitude of possible switching sequences. It should also be apparent that additional bilateral switches can be added to the circuit to increase the number of "poles" controlled through the pseudo coil terminals 1 and 2.

The preferred embodiment of the invention described herein is comprised in part of integrated circuits and in part of discrete components. The invention may also be embodied in a circuit comprised solely of discrete components, or more preferaby, of a single integrated circuit. In any case, the circuit of the present invention is preferably packaged as an integral unit which simulates the functions of a relay and which is combined with other similar integral units to simulate a relay control system.

We claim:

1. In a logic circuit for emulating the function of a relay, the combination comprising:
    a pseudo coil terminal;
    a time delay circuit having an input connected to said pseudo coil terminal, said time delay circuit being operable to generate a delayed logic signal at its output which is responsive to the logic state of said pseudo coil terminal;
    a pair of pseudo contact terminals;
    a solid state bilateral switch having a control terminal connected to the output of said time delay circuit and a pair of outputs connected to said pair of pseudo contact terminals, said bilateral switch being responsive to the logic signal generated by said time delay circuit to either open said pseudo contact terminals to block the flow of current therethrough or close said pseudo contact terminals to allow current flow in either direction therethrough;
    a second time delay circuit having an input coupled to said pseudo coil terminal, said second time delay circuit being operable to generate a delayed logic signal at its output which is responsive to the logic state of said pseudo coil terminal;
    inverter means connected in series with said second time delay circuit and being operable to generate a logic signal at its output which is the inversion of a logic signal applied to its input;
    a second pair of pseudo contact terminals;
    a second solid state bilateral switch having a control terminal coupled to the output of said second time delay circuit and a pair of outputs connected to said second pair of pseudo contact terminals, said second bilateral switch being responsive to the logic signal at the output of said second time delay circuit to either open said second pair of pseudo contact terminals to block the flow of current therethrough or close said second pair of pseudo contact terminals to allow current to flow in either direction therethrough.

2. The logic circuit as recited in claim 1 in which said first time delay circuit is bidirectional to provide one predetermined delay to a logic signal of one state at said pseudo coil terminal and a second predetermined delay to a logic signal of another state at said pseudo coil terminal, whereby said bidirectional time delay circuit allows separate determination of the pickup and dropout response of said first bilateral switch.

3. In a logic circuit for emulating the function of a relay, the combination comprising:
  a pseudo coil terminal;
  a time delay circuit having an input connected to said pseudo coil terminal and an output at which a delayed logic signal is generated which is responsive to the logic state of said pseudo coil terminal, said time delay circuit being bidirectional to provide one predetermined delay to a logic signal of one state at said pseudo coil terminal and a second predetermined delay to a logic signal of another state at said pseudo coil terminal;
  a pair of pseudo contact terminals; and
  a solid state bilateral switch having a control terminal connected to the output of said time delay circuit and a pair of outputs connected to said pair of pseudo contact terminals, said bilateral switch being responsive to the logic signal generated by said time delay circuit to either open said pseudo contact terminals to block the flow of current therethrough or close said pseudo contact terminals to allow current flow in either direction therethrough, whereby said bidirectional time delay circuit allows separate determination of the pickup and dropout response of said bilateral switch.

4. The logic circuit as recited in claim 3 wherein said bidirectional time delay circuit is comprised of two parallel branches connected to a charging capacitor, one of said branches including a resistor and the other of said branches including a resistor connected in series with a diode.

5. The logic circuit as recited in claim 4 wherein said capacitor is charged and discharged through said parallel branches and a buffer circuit connects to the charging capacitor to generate a logic signal at the output of said time delay circuit which is responsive to the voltage across said charging capacitor.

* * * * *

UNITED STATES PATENT AND TRADEMARK OFFICE
CERTIFICATE OF CORRECTION

PATENT NO. : 4,039,855
DATED : August 2, 1977
INVENTOR(S) : John E. Callan, et al It is certified that error appears in the above–identified patent and that said Letters Patent are hereby corrected as shown below:

Column 2, line 38    "dode" should be -- diode --

Column 2, line 50    "ranches" should be -- branches --

Column 2, line 52    "generates logic low" should be -- generates a logic low --

Column 3, line 8     "for" should be -- four --

Column 3, line 26    "bilateral switch opens" should be -- bilateral switch 14 opens --

Column 3, line 30    "pickup and dropout" should be -- "pickup" and "dropout" --

Column 3, line 34    "10 millisecond" should be -- 1 millisecond --

UNITED STATES PATENT AND TRADEMARK OFFICE
CERTIFICATE OF CORRECTION

PATENT NO. : 4,039,855
DATED : August 2, 1977
INVENTOR(S) : John E. Callan et al It is certified that error appears in the above-identified patent and that said Letters Patent are hereby corrected as shown below:

Column 3, line 36    "resitor" should be -- resistor --

Column 3, line 36    "my" should be -- may --

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*